(12) United States Patent
Hwang et al.

(10) Patent No.: US 6,337,505 B2
(45) Date of Patent: Jan. 8, 2002

(54) SEMICONDUCTOR DEVICE AND METHOD FOR FABRICATING THE SAME

(75) Inventors: Jeong Mo Hwang; Jeong Hwan Son, both of Taejeon-si (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/741,439

(22) Filed: Dec. 21, 2000

Related U.S. Application Data

(62) Division of application No. 09/285,258, filed on Apr. 2, 1999.

(30) Foreign Application Priority Data

Apr. 2, 1998 (KR) .............................................. 98-11669

(51) Int. Cl.[7] .......................... H01L 29/76; H01L 29/94; H01L 31/062; H01L 31/113
(52) U.S. Cl. ........................................ 257/401; 257/347
(58) Field of Search ................................ 257/401, 403, 257/205, 292, 284, 288, 347, 346, 350, 352, 353, 339, 510, 900

(56) References Cited

U.S. PATENT DOCUMENTS

| 4,951,102 A | * | 8/1990 | Beitman ..................... 357/23.4 |
| 5,324,982 A | * | 6/1994 | Nakazato et al. ........... 257/546 |
| 5,494,846 A | * | 2/1996 | Yamazaki .................... 427/67 |
| 5,877,046 A | | 3/1999 | Yu et al. |
| 5,965,917 A | | 10/1999 | Maszara et al. |
| 6,015,992 A | | 1/2000 | Chatterjee et al. |
| 6,027,983 A | * | 2/2000 | Hashimoto et al. ......... 438/426 |
| 6,034,388 A | * | 3/2000 | Brown et al. ............... 257/296 |
| 6,051,472 A | | 4/2000 | Abiko et al. |
| 6,111,296 A | * | 8/2000 | Yamazaki et al. .......... 257/401 |

OTHER PUBLICATIONS

International Electron Devices Meeting 1995 p. 627–630.
International Electron Devices Meeting 1993 p. 739–742.

* cited by examiner

*Primary Examiner*—David Nelms
*Assistant Examiner*—David Nhu

(57) ABSTRACT

A semiconductor device and a method for fabricating the same are disclosed, in which floating body effect is reduced by applying a bias to a body in an SOI MOSFET. The semiconductor device includes first and second impurity ion implanting layers of a conductivity type formed in a semiconductor substrate having a buried oxide film and surface silicon layers thereon, first and second transistors of a conductivity type respectively formed on the first and second impurity ion implanting layers, having source/drain regions and a gate, trenches formed between the first and second transistors, single crystal silicon layers connected to any one of the source/drain regions of the respective transistors and the first and second impurity ion implanting layers at sides of the trenches, and carrier exhausting electrodes connected to the first and second impurity ion implanting layers at one sides of the respective transistors, for exhausting carrier generated by ionization impact in the respective transistors.

6 Claims, 7 Drawing Sheets

SEMICONDUCTOR DEVICE AND METHOD FOR FABRICATING THE SAME

This application is a Division of Ser. No. 09/285,258, filed Apr. 2, 1999.

BACKGROUND OF THE INVENTION

1. Field of the Invention

The present invention relates to a semiconductor device, and more particularly, to a semiconductor device and a method for fabricating the same, a bias is applied to a body in a silicon on insulator (SOI) MOSFET, effectively reducing or eliminating a floating body effect otherwise experienced by the semiconductor device.

2. Discussion of the Related Art

A conventional semiconductor device will be described hereinafter with reference to the accompanying drawings.

FIG. 1 is a sectional view illustrating a structure of a conventional SOI MOSFET.

As shown in FIG. 1, in an SOI MOSFET, an SOI substrate is formed by a SIMOX(Separation by IMplantation of OXygen) method, a BESOI(Bonded and Etchback SOI) method, or a smart-cut method.

The conventional MOSFET includes a buried oxide film 2 formed on a semiconductor substrate 1 at a thickness of 1000~4000 Å, an isolation layer 3 formed by LOCOS or STI process, surface silicon layers formed on the buried oxide film 2 at a thickness of 500~2000 Å to form source/drain regions 4 and 6 and a channel region 5, a gate insulating film 7 formed on the channel region 5, a gate electrode 8 formed on the gate insulating film 7, an interleave insulating layer 9 formed on the gate electrode 8 and transistors of the source/drain regions 4 and 6 to selectively form a contact hole, and a metal electrode layer 10 connected to the source/drain regions 4 and 6 and the gate electrode 8 through the contact hole of the interleave insulating layer 9.

A thermal oxide film having a thickness of 50~100 Å, which is grown by thermal oxidation process, is mainly used as the gate insulating film 7.

An impurity ion is implanted into the channel region 5 to adjust a threshold voltage.

If the MOSFET is an NMOS transistor, B or $BF_2$ is used as the impurity ion. Alternatively, if the MOSFET is a PMOS transistor, P or As is used as the impurity ion.

A doped polysilicon is mainly used as the gate electrode 8. If the MOSFET includes both NMOS and PMOS transistors, $n^+$ type doped polysilicon may be used as the gate electrode 8. An $n^+$ type doped polysilicon may also be used as the gate electrode 8 if the MOSFET is an NMOS transistor, but a $p^+$ type doped polysilicon may be used as the gate electrode 8 if the MOSFET is a PMOS transistor.

After the gate electrode 8 is formed, the impurity ion is implanted to form the source/drain regions 4 and 6. For NMOS transistors, As is implanted at a dose of $2$~$5E15cm^{-2}$. For PMOS transistors, B or $BF_2$ is implanted at a dose of $1$~$3E15cm^{-2}$.

At this time, a lightly doped drain (LDD) region may be formed to prevent the deterioration of device characteristic due to hot carriers.

The SOI device serves as a conventional bulk device. The channel region of the NMOS and PMOS transistors in these conventional MOSFET devices remains floating. Therefore, in the NMOS transistor, a floating body effect may be experienced since holes may accumulate in a body based on alpha particles or in the course of operating the device.

Due to this floating body effect, the conventional semiconductor device is susceptible to several problems. For instance, the breakdown voltage may be reduced by the floating body effect, and distortion may occur in Id-Vd curve, thereby deteriorating characteristic of the device. Further, an abnormal slope of subthreshold may occur and the operation of the device may become unstable due to transient effect in the course of AC operation.

SUMMARY OF THE INVENTION

The present invention is directed to a semiconductor device and a method for fabricating the same that substantially obviate one or more of the above and other problems experienced by conventional devices due to limitations and disadvantages of the related art.

An object of the present invention is to provide a semiconductor device and a method for fabricating the same in which a bias is applied to a body in an SOI MOSFET, thereby reducing or eliminating a floating body effect.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device according to the present invention includes first and second impurity ion implanting layers of a conductivity type formed in a semiconductor substrate having a buried oxide film and surface silicon layers thereon, first and second transistors of a conductivity type respectively formed on the first and second impurity ion implanting layers, having source/drain regions and a gate, trenches formed between the first and second transistors, single crystal silicon layers connected to any one of the source/drain regions of the respective transistors and the first and second impurity ion implanting layers at sides of the trenches, and carrier exhausting electrodes connected to the first and second impurity ion implanting layers at one sides of the respective transistors, for exhausting carrier generated by ionization impact in the respective transistors.

In another aspect, a method for fabricating a semiconductor device according to the present invention includes the steps of sequentially forming a pad oxide film and a nitride film on a semiconductor substrate having a buried oxide film and surface silicon layers thereon, selectively etching the pad oxide film and the nitride film to form trenches, forming undoped polysilicon sidewalls at sides of the trenches, thermally oxidizing outer sides of the undoped polysilicon sidewalls to form a first dielectric layer, recrystallizing inner sides of the undoped polysilicon sidewalls using the silicon layers and a body of the semiconductor substrate as seeds to form single crystal silicon layers, depositing an oxide film on an entire surface including the trenches and planarizing the oxide film to form a second dielectric layer, selectively removing the nitride film and the pad oxide film, forming a first photoresist and patterning the first photoresist to remain on a portion where a PMOS transistor will be formed, implanting an impurity ion into a channel region of the surface silicon layers and single crystal silicon layer at one sides of the trenches, and the body of the semiconductor substrate using the first photoresist as a mask, forming a gate oxide film and a gate electrode on the channel region into which the impurity ion is implanted, selectively implanting the impurity ion into the gate oxide film and the gate electrode to form source/drain regions, and forming carrier exhausting electrodes on the surface silicon layers at the other sides of the trenches.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In MOSFET according to the present invention, when etching a buried oxide film to form an isolation layer, a semiconductor substrate below the buried oxide film is also etched. A polysilicon layer is formed as a sidewall and then recrystallized. An impurity ion is implanted into the polysilicon layer and thus a body of the semiconductor substrate is contacted with impurity ion implanting layers.

Figure 2A:
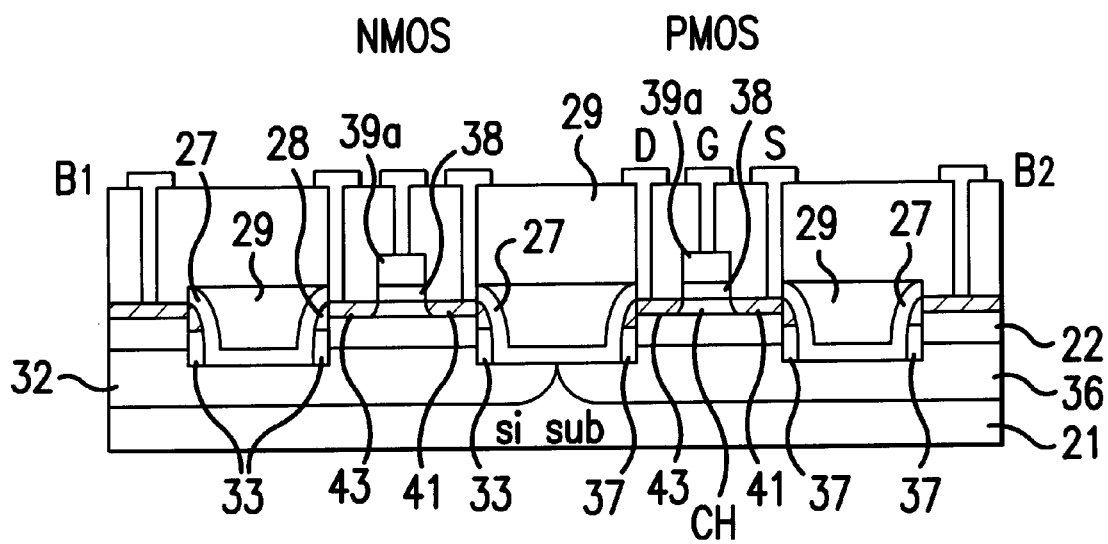
FIGS. 2a to 2b are sectional views illustrating exemplary structures of a MOSFET according to the present invention.
Figure 2B:
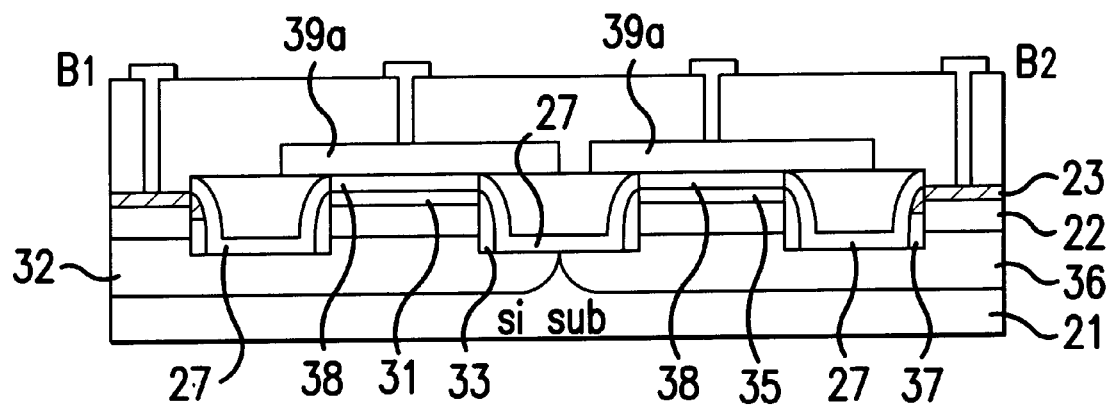

As shown in FIGS. 2a and 2b, the semiconductor device of the present invention includes a first impurity ion implanting layer 31 of a p type and a first impurity ion implanting layer 35 of an n type, a second impurity ion implanting layer 32 of a p type and a second impurity ion implanting layer 36 of an n type formed in an SOI semiconductor substrate 21, and a third impurity ion implanting layer 33 of a p type and third impurity ion implanting layer 37 of an n type. A buried oxide film 22 and silicon layers 23 are positioned on layers 32 and 36 and are used as well regions. Silicon layer 23 is not shown in FIGS. 2a and 2b because source/drain regions 41 and 43 and a channel region CH are respectively formed in the silicon layers 23 on the buried oxide film 22. Sidewall type single crystal silicon layers 28 are connected to the source/drain regions 41 and 43 at sides of trenches formed in portions excluding the source/drain regions 41 and 43 and the channel region CH. A first dielectric layer 27 is formed in the entire surface of the trenches in which the single crystal silicon layers 28 are formed. A second dielectric layer 29 is formed on the first dielectric layer 27 by fully burying the trenches. A gate oxide film 38 and a gate electrode 39a are formed on the channel region CH.

A metal electrode layer is formed on the source/drain region 41 and 43, and on the gate electrode 39a. The trenches are formed up to a certain depth of a body of the semiconductor substrate 21.

The single crystal silicon layers 28 are doped with the same impurity ion as the impurity ion for the formation of the source/drain regions 41 and 43. They remain in contact with the second impurity ion implanting layer 32 and the second impurity ion implanting layer 36.

To avoid accumulation of carriers in the body, B1 and B2 electrodes (carrier exhausting electrodes) are respectively formed at the other sides of the trenches formed in portions other than portions where NMOS and PMOS transistors are formed. These B1 and B2 electrodes are connected with the source/drain regions 41 and 43 of the respective transistors through the second and third impurity ion implanting layers 32 and 33 of a p type and the second and third impurity ion implanting layers 36 and 37 of an n type.

The B1 and B2 electrodes serve to exhaust holes or electrons generated by ionization impact.

A method for fabricating the semiconductor device according to the present invention will be described below with respect to FIGS. 3a–3n.

Figure 3A:
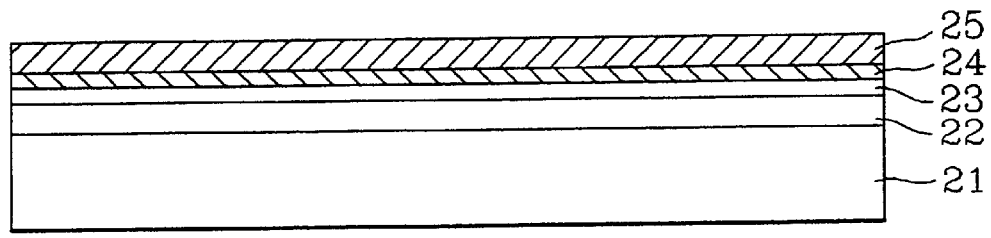
FIGS. 3a to 3n are sectional views illustrating exemplary process steps involved in forming a MOSFET according to the present invention.

As shown in FIG. 3a, to form an isolation layer, a pad oxide film 24 and a nitride film 25 are sequentially formed on a stacked combination of a SOI semiconductor substrate 21, a buried oxide film 22 and a silicon layer 23. The buried oxide film 22 has a thickness of 1000~4000 Å and the silicon layer 23 has a thickness of 300~2000 Å.

At this time, the pad oxide film 24 has a thickness of 100~500 Å which is achieved by a thermal oxidation or a chemical vapor deposition (CVD) process, and the nitride film 25 has a thickness of 500~2000 Å, which is achieved by a CVD process. The nitride film 25 may be replaced with another dielectric having etching selectivity against the oxide film and silicon.

Figure 3B:
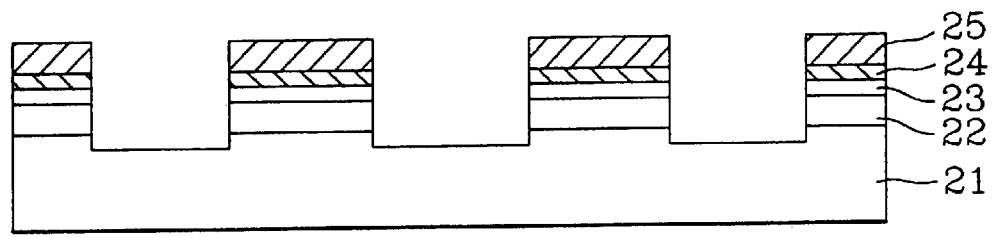

Subsequently, as shown in FIG. 3b, the nitride film 25, the. pad oxide film 24 and the SOI semiconductor substrate 21 are selectively etched to form trenches. Various methods of etching are well known to those of ordinary skill to perform this etching process, e.g., selective etching via a mask. At this time, the substrate below the buried oxide film 22 is etched at a depth of 300~1000 Å.

Figure 3C:
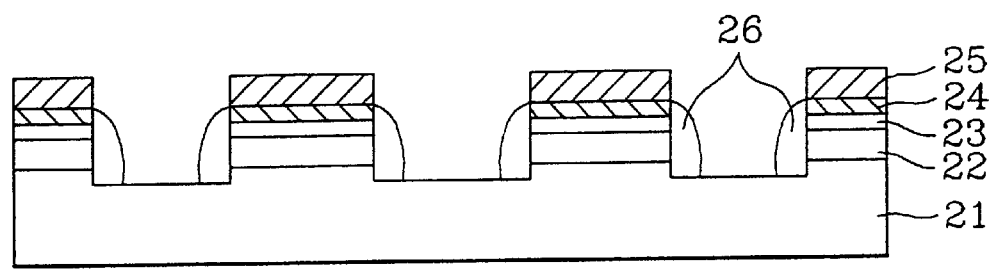

As shown in FIG. 3c, an undoped polysilicon is deposited on the entire surface of the nitride film 25 including the trenches at a thickness of 500~1500 Å and then etched using well known methods to remain only on sides of the trenches so as to form sidewalls 26. Alternatively, the undoped polysilicon film may be deposited only in the trenches.

Figure 3D:
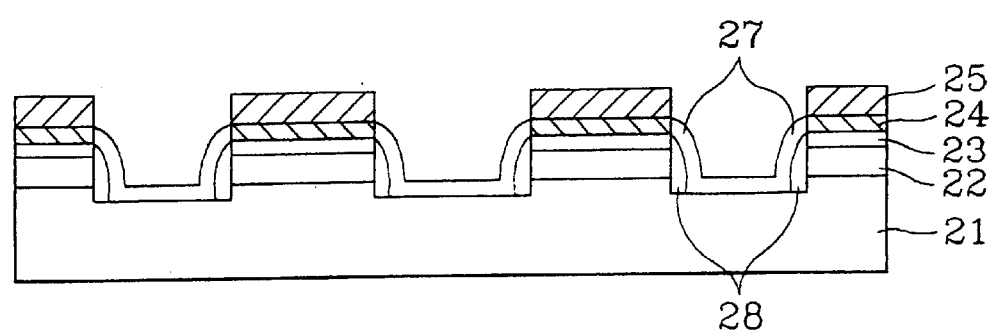

As shown in FIG. 3d, the semiconductor substrate 21 having sidewalls 26 of undoped polysilicon is thermally oxidized. As a result, outer portions of the sidewalls 26 become a first dielectric layer 27, and inner portions of the sidewalls 26 are recrystallized using the silicon layer 23 and the body of the semiconductor substrate 21 as seeds to become single crystal silicon layers 28.

At this time, the oxidized first dielectric layer 27 has a thickness of 50~200 Å and the single crystal. silicon layers 28 have a thickness of 100~300 Å.

Figure 3E:
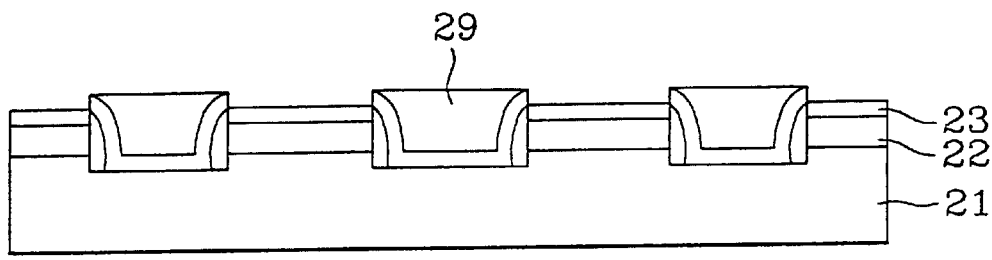

As shown in FIG. 3e, an oxide film is deposited on the entire surface including the trenches by e.g., a CVD or a high density plasma (HDP) process, and then planarized by e.g., a chemical mechanical polishing (CMP) process, to form a second dielectric layer 29. Then, the nitride film 25 and the pad oxide film 24 are selectively removed using well known processes. For instance, the pad oxide film 24 may be removed by a wet etching process.

Figure 3F:
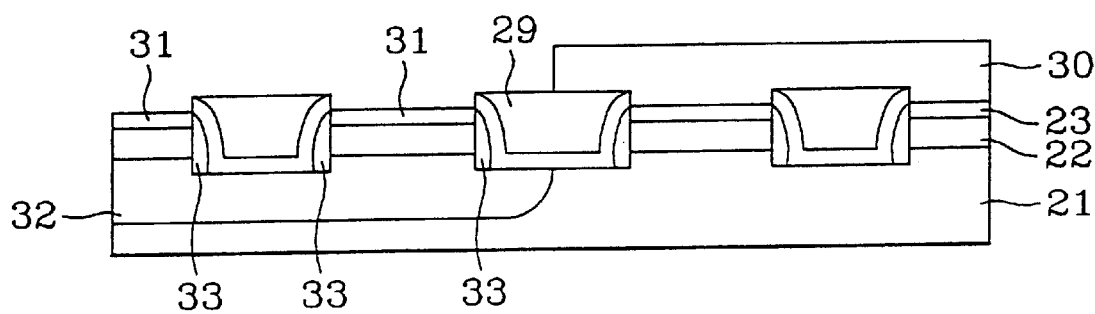

As shown in FIG. 3f, a first photoresist 30 is formed and then selectively patterned to remain on a portion where a PMOS transistor will be formed. Using first photoresist 30 as a mask, impurity ion implantation for connection between adjacent single crystal silicon layers 28 is performed to form first, second, and third impurity ion implanting layers 31, 32 and 33 of a p type.

For instance, impurity ion implantation for adjustment of a threshold voltage of the channel region in the NMOS transistor is then performed at a dose of 0.5E12~2E12 atoms/cm$^2$, thereby forming first impurity ion implanting layer 31. In addition, impurity ion implantation for connection between the single crystal layers 28 is performed at a dose of 1E13~5E14 atoms/cm$^2$ so as to implant impurity ions into the single crystal silicon layers 28 and the body of the SOI semiconductor substrate 21, thereby forming second and third impurity ion implanting layers 32 and 33.

As described, the ion implantation energy may be adjusted to achieve implantation at a suitable junction depth for each impurity layer. B or BF$_2$ is used as the impurity ion.

Figure 3G:
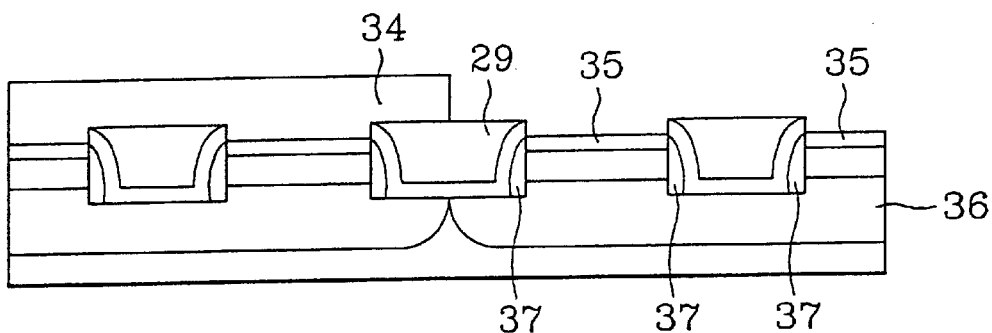

Subsequently, as shown in FIG. 3g, a second photoresist 34 is formed and then patterned to remain on a portion where an NMOS transistor will be formed.

In the same manner as the NMOS transistor, impurity ion implantation is performed using the second photoresist 34 as a mask to form first, second and third impurity ion implanting layers 35, 36 and 37 of an n type. P or As is used as the impurity ion.

Figure 3H:
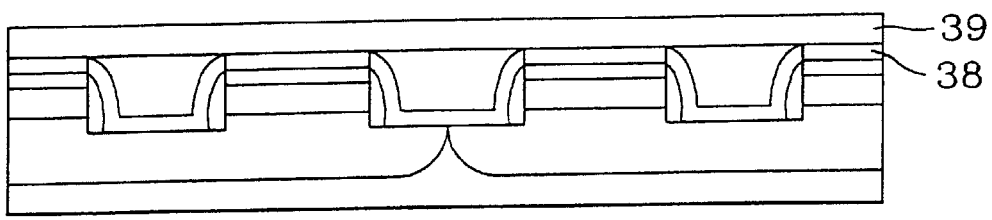

As shown in FIG. 3h, a gate oxide film 38 is formed on the first impurity ion implanting layer 31 of a p type and the first impurity ion implanting layer 35 of an n type at a thickness of 40~100 Å by thermal oxidation. A material layer 39 for the formation of a gate electrode is formed on the entire surface including the gate oxide film 38.

Polysilicon into which heavily doped impurity ion of an n type is implanted may be used as the material layer 39 in both NMOS and PMOS transistors. For instance, polysilicon into which heavily doped impurity ion of an n type is implanted may be used as the material layer 39 in case of the NMOS transistor of dual gate structure, while polysilicon into which heavily doped impurity ion of a p type is implanted may be used as the material layer 39 in case of the PMOS transistor. Alternatively, after an undoped polysilicon layer is formed on the entire surface including gate oxide film 38, the appropriate impurity ion is respectively implanted into the undoped polysilicon layers corresponding to each of the NMOS and PMOS transistors.

A metal layer or a metal silicide layer (not shown) may be formed on he material layer 31 to reduce the gate resistance.

Figure 1:
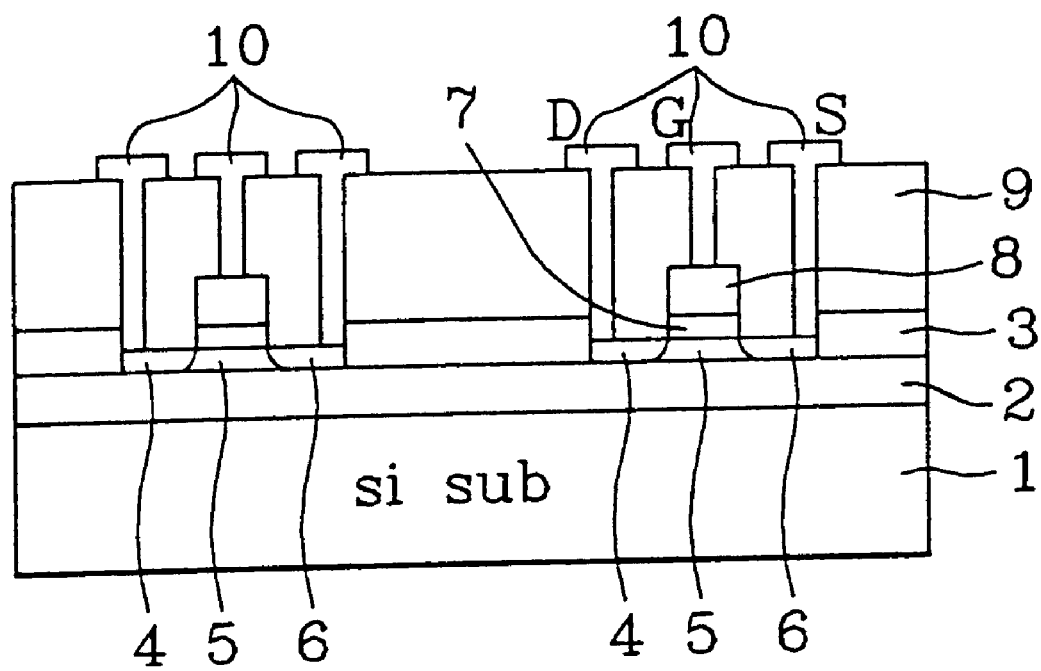
FIG. 1 is a sectional view illustrating a structure of a conventional MOSFET.
Figure 3I:
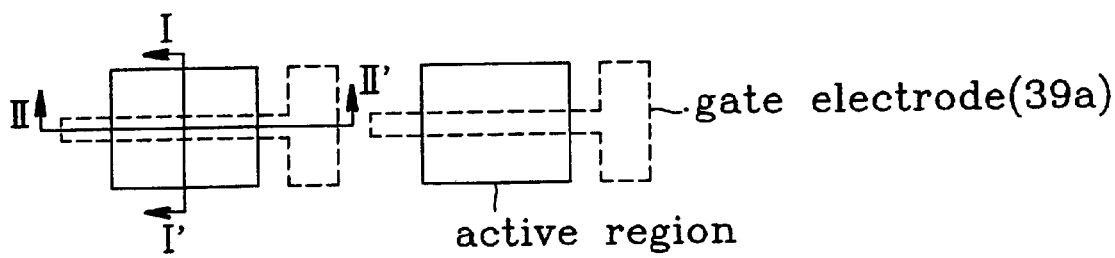
Figures 1, 3I:
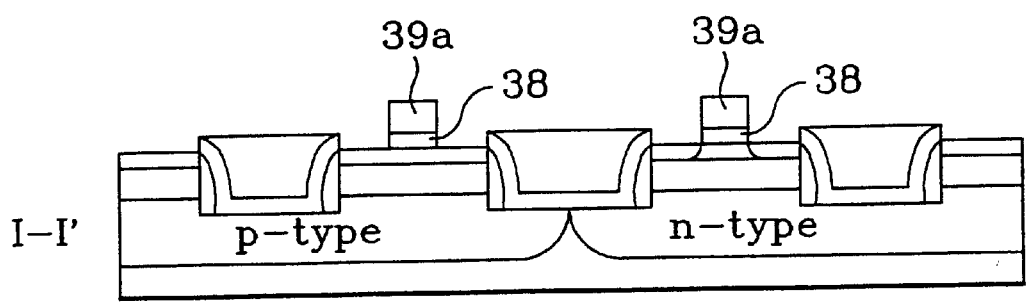
Figures 2, 3I:
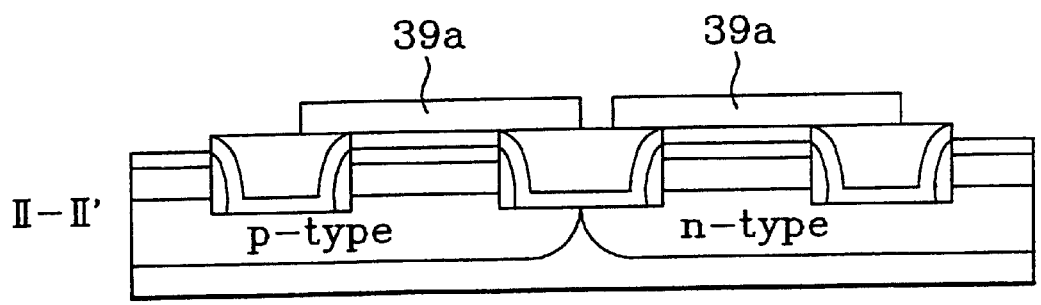

As shown in FIGS. 3i, 3i-1, and 3i-2, the material layer 39 used for the formation of a gate electrode and the gate oxide film 38 are selectively etched. The etched portion of material layer 39 forms a gate electrode 39a.

Figure 3J:
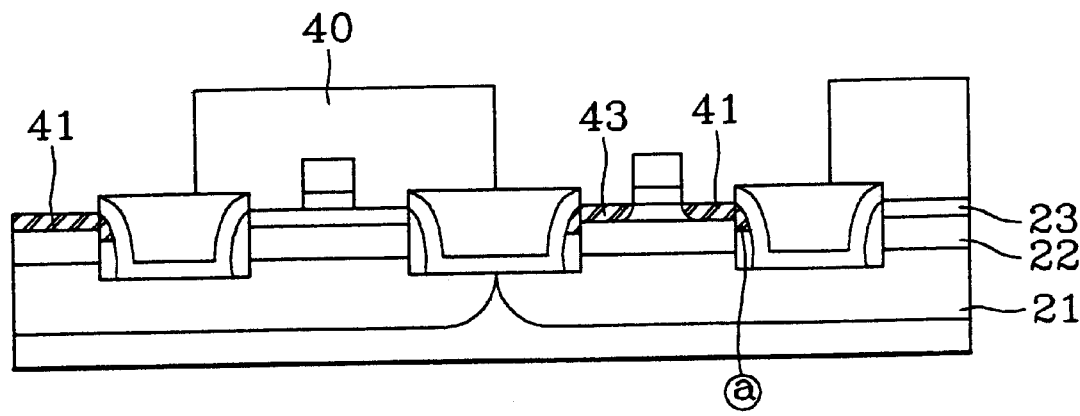

Subsequently, as shown in FIG. 3j, a third photoresist 40 is deposited on the entire surface of the semiconductor substrate 21 in which the gate electrode 39a is formed. The third photoresist 40 is then selectively patterned to remain on a portion where the NMOS transistor will be formed. A heavily doped impurity ion implantation of a p type is performed using the third photoresist 40 as a mask to form the source/drain regions 41 and 43 of the PMOS transistor.

At this time, an impurity ion is implanted down to the single crystal silicon layer 28 (up to (a) portion) connected to the body of the semiconductor substrate 21.

Figure 3K:
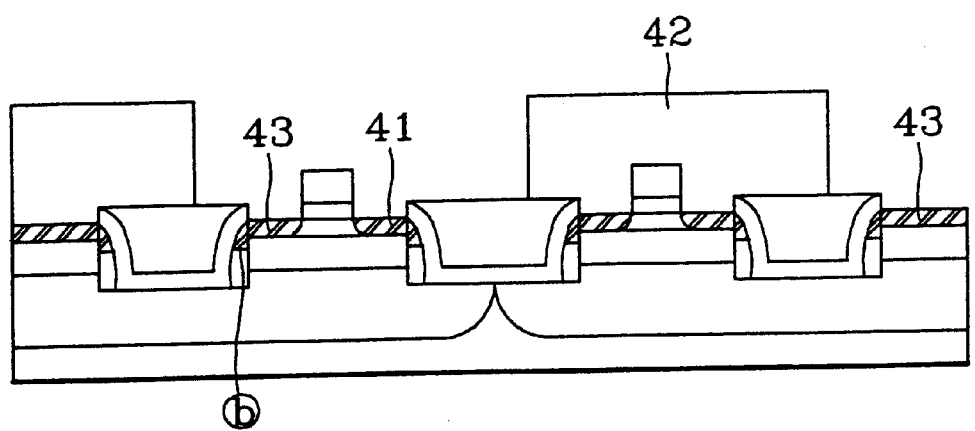

As shown in FIG. 3k, a fourth photoresist 42 is deposited on the entire surface of the semiconductor substrate 21 in which the gate electrode 39a is formed, and selectively patterned to remain on a portion where the PMOS transistor will be formed. Impurity ion implantation is performed using the fourth patterned photoresist 42 as a mask to form the source/drain regions 41 and 43 of the NMOS transistor.

Figure 3L:
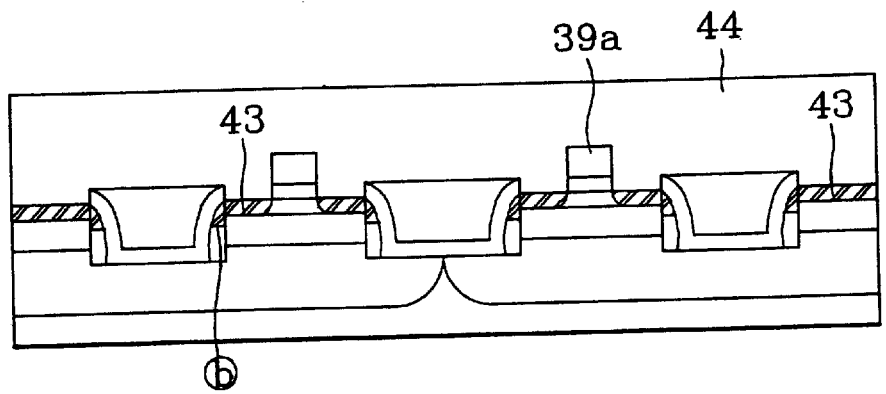
Figure 3M:
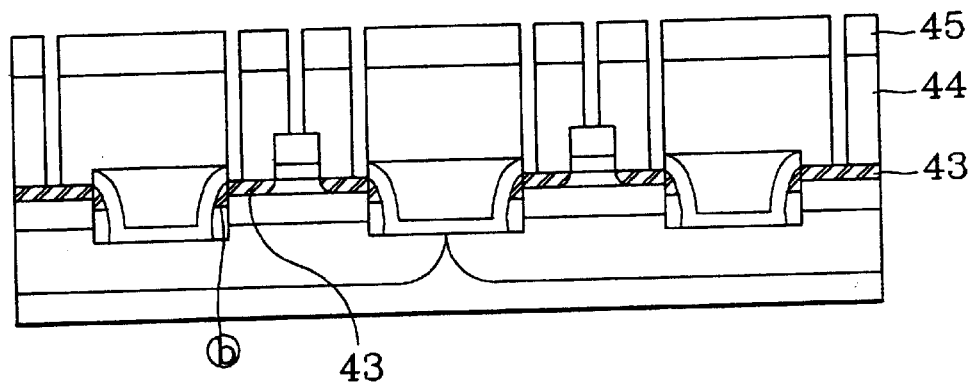
Figure 3N:
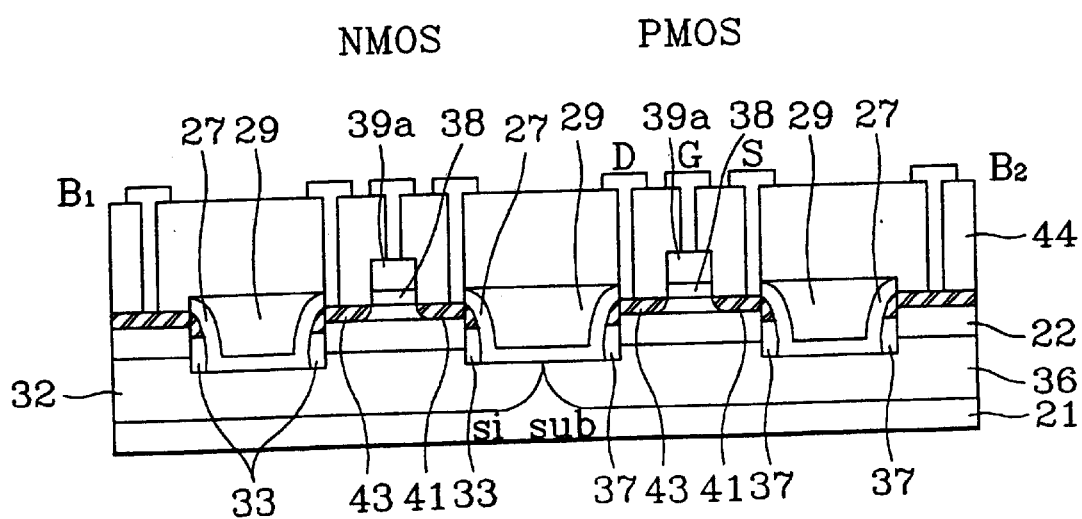

As shown in FIGS. 3l-3n, to avoid an accumulation of carriers in the body of the substrate 21, B1 and B2 electrodes (carrier exhausting electrodes) are respectively formed at opposite sides of the respective transistors. More specifically, as shown in FIGS. 3l-3n, a layer insulating film 44 and fifth photoresist 45 are subsequently deposited on the entire surface of the semiconductor substrate 21 in which a gate electrode 39a and a source/drain region 43 are formed. The fifth photoresist 45 is selectively patterned. The layer insulating film 44 is then etched using the mask to form a contact hole where a carrier exhausting electrodes B1 and B2 will be formed. A metal material is then buried into the contact hole to form the carrier exhausting electrodes B1 and B2. The fifth photoresist 45 remaining on the layer insulating film is removed.

That is, one electrode B1 or B2 is formed per transistor, the electrodes being positioned on opposite and distant sides of the transistors. These B1 and B2 electrodes serve to exhaust holes or electrons, which are generated by ionization impact, through the second and third impurity ion implanting layers 32 and 33 of a p type and the second and third impurity ion implanting layers 36 and 37 of an n type.

At this time, an impurity ion is implanted down to the single crystal silicon layer 28 (up to (b) portion) connected to the body of the semiconductor substrate 21, the impurity ions being implanted throughout the entire non-masked portion.

After the source/drain regions 41 and 43 are formed, an annealing process such as furnace annealing or rapid thermal annealing(RTA) is performed to diffuse the impurity ion.

As aforementioned, the semiconductor device of the present invention has the following advantages.

Since the body in the NMOS and PMOS transistors is contacted with outer electrodes, it is possible to prevent characteristic of the device from being deteriorated due to floating body effect. In other words, in the NMOS transistor, the electrons generated around the drain by ionization impact exhaust towards the drain by means of the drain field and the holes exhaust towards the B1 electrode (carrier exhausting electrode) through the second and third impurity ion implanting layers of p type connected in width direction of the gate electrode. In the PMOS transistor, since the electrons exhaust towards the B2 electrode (carrier exhausting electrode), carriers are not accumulated in the body. This increases breakdown voltage without causing distortion in the Id-Vd curve. Further, an abnormal slope of subthreshold does not occur and unstable operation of the device due to transient effect in the course of AC operation is prevented, thereby improving operation characteristic of the device.

It will be apparent to those skilled in the art that various modifications and variations can be made in the semiconductor device and the method for fabricating the same according to the present invention without departing from the spirit or scope of the invention. For instance, the order of ion implantation described in FIGS. 3f and 3g may be reversed. Thus, it is intended that the present invention covers the modifications and variations of the invention provided they come within the scope of the appended claims and their equivalents.

What is claimed is:

1. A semiconductor device comprising:
   first and second impurity ion implanting layers of a conductivity type formed in a semiconductor substrate having a buried oxide film and surface silicon layers thereon;

first and second transistors of a conductivity type respectively formed on the first and second impurity ion implanting layers, having source/drain regions and a gate; and carrier exhausting electrodes connected to the first and second impurity ion implanting layers at one side of each respective transistor, where the carrier exhausting electrodes exhaust carriers generated by ionization impact in the respective transistors.

2. The semiconductor device claimed in claim 1, further comprising:

trenches formed between the first and second transistors; and single crystal silicon layers, each being connected to any one of the source/drain regions of the respective transistors and the first and second impurity ion implanting layers at sides of the trenches.

3. The semiconductor device claimed in claim 1, wherein an impurity ion is implanted into at least one of the source/drain regions of the respective transistors, and into the single crystal silicon layers connected to the first and second impurity ion implanting layers.

4. The semiconductor device claimed in claim 2, wherein the single crystal silicon layers are formed at sides of the trenches in a sidewall form.

5. The semiconductor device claimed in claim 2, wherein the trenches are formed up to a certain depth in the body of the semiconductor substrate below the buried oxide film.

6. A semiconductor device comprising:

impurity ion implanting layers of p and n types that are formed in a semiconductor substrate having a buried oxide film and surface silicon layers thereon and that are used as well regions;

NMOS and PMOS transistors including source/drain regions and a channel region that is formed in the surface silicon layers on the impurity ion implanting layers;

a gate electrode formed on the channel region;

trenches formed in a portion of the semiconductor substrate excluding the source/drain regions and the channel region having a predetermined depth;

single crystal silicon layers formed at sides of the trenches, each single crystal silicon layer being connected to any one of the source/drain regions;

a first dielectric layer formed in an entire surface in the trenches in which the single crystal silicon layers are formed;

a second dielectric layer formed within a cavity of the trenches that is defined by the first dielectric layer; and first and second carrier exhausting electrodes for exhausting carriers generated by ionization impact, the electrodes being connected to the single crystal silicon layers and being connected to each other through the impurity ion implanting layers of p and n types.

* * * * *